United States Patent
Ali et al.

(10) Patent No.: US 6,772,380 B1
(45) Date of Patent: Aug. 3, 2004

(54) SMART TESTER AND METHOD FOR TESTING A BUS CONNECTOR

(75) Inventors: Abbas Ali, Bloomington, MN (US); Mark J. Falvey, Burnsville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/553,078

(22) Filed: Apr. 20, 2000

Related U.S. Application Data (60) Provisional application No. 60/130,275, filed on Apr. 21, 1999.

(51) Int. Cl.[7] .............................................. G01R 31/28
(52) U.S. Cl. ........................................ 714/724; 324/539
(58) Field of Search ............................. 714/42, 25, 44, 714/47–48, 724; 324/537, 543, 538, 539, 765, 771, 713, 73.1, 628; 73/573; 710/62–64, 104, 100, 300–302; 379/21–24, 27.01, 30; 361/679

(56) References Cited

U.S. PATENT DOCUMENTS

| | | |
|---|---|---|
| 4,847,838 A | 7/1989 | Kralik |
| 4,888,773 A | 12/1989 | Arlington et al. |
| 5,031,054 A | 7/1991 | Lewis ........................... 360/31 |
| 5,218,307 A | 6/1993 | Hiller .......................... 324/541 |
| 5,231,357 A * | 7/1993 | Moody et al. ............... 324/539 |
| 5,367,647 A | 11/1994 | Coulson et al. |
| 5,421,014 A | 5/1995 | Bucher |
| 5,442,299 A | 8/1995 | Caggiano ..................... 324/758 |
| 5,504,689 A | 4/1996 | Fiebrich et al. |
| 5,654,841 A | 8/1997 | Hobson et al. ................ 360/75 |
| 5,821,760 A * | 10/1998 | Koeman et al. ............. 324/628 |
| 5,835,700 A * | 11/1998 | Carbonneau et al. ......... 714/44 |

* cited by examiner

Primary Examiner—Guy Lamarre
(74) Attorney, Agent, or Firm—Kirk A. Cesari (57) ABSTRACT

A system for testing a bus connector comprising an electronically controlled switch operatively coupled to be controlled by a microprocessor, the system having a first input operatively coupled to receive power from an internal power supply and a second input operatively coupled to receive power from a power supply connector, and an output operatively coupled to power an output display selectively from either power supplies.

9 Claims, 6 Drawing Sheets

*FIG. 6*

SMART TESTER AND METHOD FOR TESTING A BUS CONNECTOR

RELATED APPLICATIONS

This application claims the benefit under 35 U.S.C. 119(e) of U.S. Provisional Application Serial No. 60/130,275 filed Apr. 21, 1999.

FIELD OF THE INVENTION

The present invention relates to the field of mass-storage devices. More particularly, this invention relates to a smart tester and method for testing a bus connector, for example a SCSI connector for a SCSI disc drive.

BACKGROUND OF THE INVENTION

Devices that store data are key components of any computer system. Computer systems have many different types of devices where data can be stored. One common device for storing massive amounts of computer data is a disc drive. The basic parts of a disc drive are a disc assembly having at least one disc that is rotated, an actuator that moves a transducer to various locations over the rotating disc, circuitry that is used to write and/or read data to and from the disc via the transducer, and a bus interface to connect the disc drive into an information-handling system. The disc drive also includes circuitry for encoding data so that it can be successfully retrieved from and written to the disc surface. A microprocessor controls most of the operations of the disc drive, in addition to passing the data back to the requesting computer and receiving data from a requesting computer for storing to the disc.

The disc drive includes a transducer head for writing data onto circular or spiral tracks in a magnetic layer the disc surfaces and for reading the data from the magnetic layer.

The transducer is typically placed on a small ceramic block, also referred to as a slider, that is aerodynamically designed so that it flies over the disc. The slider is passed over the disc in a transducing relationship with the disc. Most sliders have an air-bearing surface ("ABS") which includes rails and a cavity between the rails. When the disc rotates, air is dragged between the rails and the disc surface causing pressure, which forces the head away from the disc. At the same time, the air rushing past the cavity or depression in the air bearing surface produces a negative pressure area. The negative pressure or suction counteracts the pressure produced at the rails. The slider is also attached to a load spring that produces a force on the slider directed toward the disc surface. The various forces equilibrate so that the slider flies over the surface of the disc at a particular desired fly height. The air lubrication film eliminates the friction and resulting wear that would occur if the transducing head and disc were in mechanical contact during disc rotation. In some disc drives, the slider passes through a layer of lubricant rather than flying over the surface of the disc.

Information representative of data is stored on the surface of the storage disc. Disc-drive systems read and write information stored on tracks on storage discs. Transducers, in the form of read/write heads attached to the sliders, located on both sides of the storage disc, read and write information on the storage discs when the transducers are accurately positioned over one of the designated tracks on the surface of the storage disc. The transducer is also said to be moved to a target track. As the storage disc spins and the read/write head is accurately positioned above a target track, the read/write head can store data onto a track by writing information representative of data onto the storage disc. Similarly, reading data on a storage disc is accomplished by positioning the read/write head above a target track and reading the stored material on the storage disc. To write on or read from different tracks, the read/write head is moved radially across the tracks to a selected target track. The data is divided or grouped together on the tracks. In some disc drives, the tracks are a multiplicity of concentric circular tracks. Servo feedback information is used to accurately locate the transducer. The actuator assembly is moved to the required position and held very accurately during a read or write operation using the servo information.

One bus interface often used to connect the disc drive into an information-handling system is a SCSI (small computer system interface) bus of one type or another. A plug (typically specified by a SCSI standards committee) is built onto an edge of the disc drive, and is inserted into a socket (also typically specified by the SCSI standards committee) on a SCSI bus. SCSI busses and their respective sockets and plugs can be differential or single-ended (defining the electrical properties), and can be narrow, wide, or ultra-wide (defining the number of connecting wires and pins).

In the manufacture of disc drives, it is desirable to test and "burn in" the disc drives as part of the manufacturing process. In some situations, numerous "bins" as many as a thousand or more) are provided in one or more large test stations, each bin having rails to physically hold the disc drive temporarily for the test, and one or more sockets (for example a SCSI bus socket and an electrical power socket) to electrically couple the disc drive to the test system. Manual testing of SCSI bin connectors is tedious, time consuming, and error prone.

In the manufacture of computers or other information-handling systems, SCSI sockets are provided for later connection to SCSI devices such as disc drives. Manual testing of SCSI connectors in manufactured information-handling systems is also tedious, time consuming, and error prone.

There is, therefore, a need for an improved tester and method for testing a connector to bus, for example, for a SCSI connector in a SCSI disc-drive-testing bin or for a SCSI connector in an information-handling system.

SUMMARY OF THE INVENTION

A smart tester and method are described for testing a bus connector. In one embodiment, a SCSI bin tester is provided, which tests for various opens and shorts, and for conformance of the voltage supply to its specification.

One aspect of the present invention provides a system for testing a bus connector includes a microprocessor, a first analog multiplexor and an analog demultiplexor both coupled to a first electrical connector, an analog-to-digital converter (ADC) circuit, and a voltage source. The first analog multiplexor is operatively coupled to be controlled by the microprocessor, receiving input from the first electrical connector. The analog-to-digital converter (ADC) circuit is operatively coupled to receive an analog signal from the first analog multiplexor and to provide to the microprocessor a digital signal representative of a voltage on the first electrical connector. The first electrical connector has a plurality of connection pins suitable for connection to the bus connector, and is operatively coupled to provide inputs to the first analog multiplexor. The analog demultiplexor is operatively coupled to be controlled by the microprocessor, and has a plurality of analog output connections operatively coupled to the first electrical connector. The voltage source operatively coupled to provide at least one predetermined voltage as an input to the analog demultiplexor. Such a system allows the bus connector to be tested for shorted faults and opened faults.

Another aspect of the present invention provides a method for testing a bus connector including a plurality of connection pins. The method includes selecting a first test input voltage, automatically controlling a coupling of the first test input voltage to a first one of the connection pins, measuring a voltage of a second one of the connection pins, generating a first digital value representative of the voltage on the second pin that resulted from applying the first voltage to the first pin, automatically comparing the first digital value to a predetermined first expected value, and providing an output indication based on the comparison.

Yet another aspect of the present invention provides an electrical connector having a plurality of connection pins suitable for connection to the bus connector, a voltage source operatively coupled to provide a signal, and automatic means as described herein for serially applying the signal to each one of a first set of the plurality of connection pins and measuring a resulting parameter of each one of a second set of the plurality of connection pins.

DESCRIPTION OF THE PREFERRED EMBODIMENT

In the following detailed description of the preferred embodiments, reference is made to the accompanying drawings which form a part hereof, and in which are shown, by way of illustration, specific embodiments in which the invention may be practiced. It is to be understood that other embodiments may be utilized and structural changes may be made without departing from the scope of the present invention.

High-performance disk drives require testing and calibration as part of the manufacturing process. When a SCSI interface is used, the disc drive is typically slid into a SCSI test bin (simply called a "bin"), and thus plugged into a SCSI connector and a power-supply connector of the bin. A tester system can have many such bins, each having such connectors. These electrical connectors and their internal connection need to be tested in order to isolate any faults to the disc drive or other device being tested (i.e., without such tests, it would be difficult to determine whether a fault was in the disc drive or in the connector and its wiring to the test system). In some embodiments, the bins are enclosed in a computer-controlled variable environment enclosure, in order to allow testing at various temperatures, humidity levels, vibration levels, and/or other environmental factors.

In some embodiments, the present invention provides a smart (i.e., computer-controlled) SCSI bin tester that tests both the SCSI connector and its wiring, as well as the power-supply connector and its voltage supplies, in a tester bin. In some embodiments, the tester is provided with a set of one or more plugs that mate with corresponding sockets in the bin. The tester is inserted into the bin, and a series of individual wire tests is performed (e.g., a voltage is applied to a single "probe-input" pin of the SCSI connector, and every other pin is tested to determine whether the "probe-input" pin is properly wired). If a short, open, or other mis-wiring is detected, the smart tester indicates the type or fault and the pins involved, in order to facilitate repair. In some embodiments, further tests are performed on the power supply, by measuring the voltage under various applied loads, and comparing the results with a power-supply specification to determine whether the power supply is within acceptable tolerances. An appropriate display of the measured voltages and/or whether the supply is within specified tolerances is provided. Thus, a single automated instrument is provided to test the device connector(s) and provide an indication that all is well, or if not, an indication of the type and location of the detected fault.

One embodiment of the invention described in this application is useful for all types of SCSI device connectors, including, for example, those for hard-disc drives, and any other type of drives, systems of drives (such as a "redundant array of inexpensive/independent disc drives," or RAID, configuration) or other devices, where a SCSI interface and/or its voltage supply need to be tested. Other embodiments are useful for other types of terminated differential busses, with appropriate changes to the drive voltages and resistances.

The invention described in this application is useful with many electrical and mechanical configurations of disc drives having either rotary or linear actuation. In addition, the invention is also useful in all types of disc drives including hard disc drives, zip drives, floppy disc drives and any other type of drives where providing a low-noise current source for the transducer may be desirable.

Figure 1:
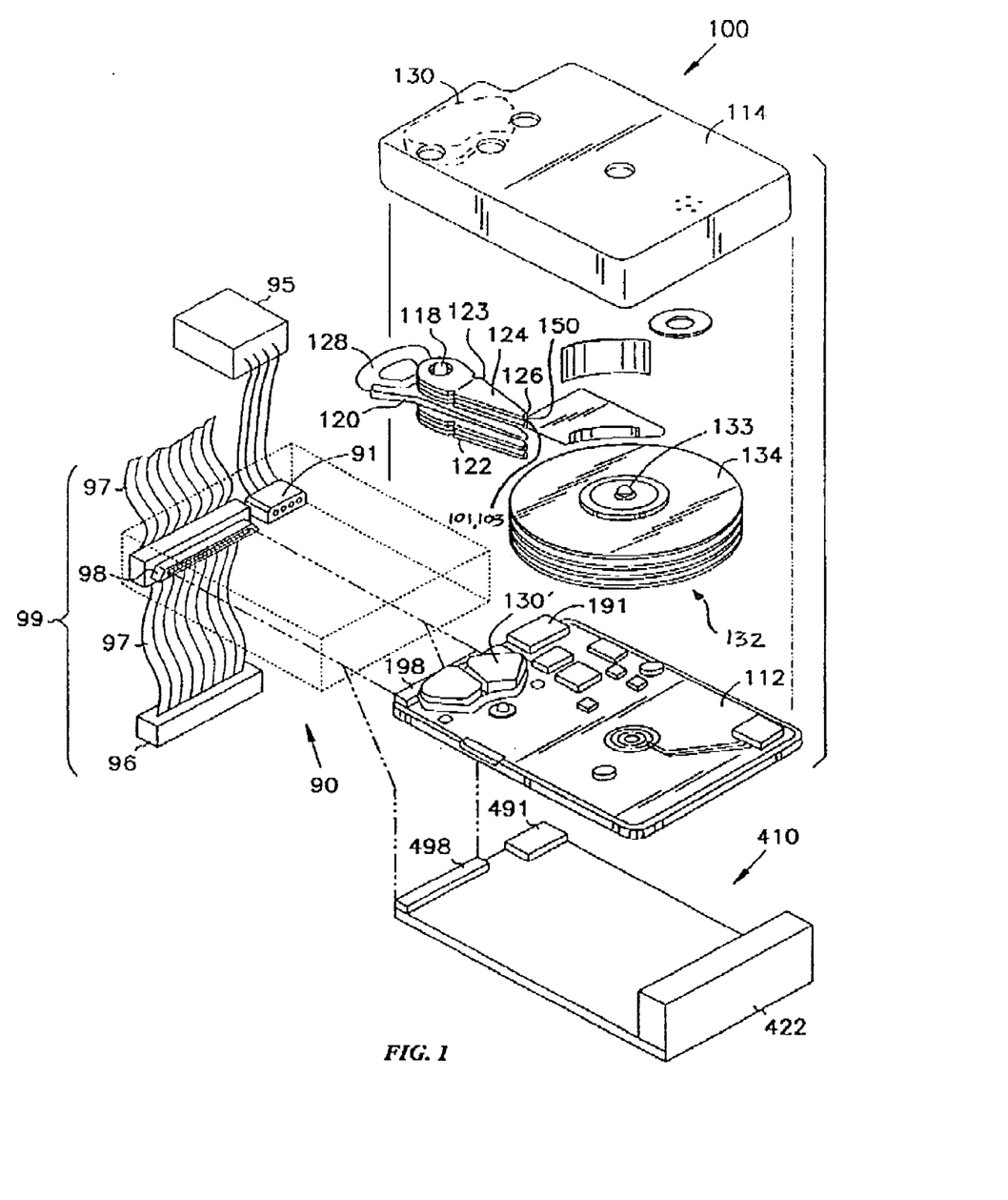
FIG. 1 is an exploded view of a disc drive 100 and a bin 90.

FIG. 1 is an exploded view of one embodiment of the present invention, this embodiment showing one type of a disc drive 100 having a rotary actuator 99. The disc drive 100 includes a housing formed of base 112 and cover 114. The base 112 and cover 114 form a disc enclosure. Rotatably attached to the base 112 on an actuator shaft 118 is an actuator assembly 120. The actuator assembly 120 includes a comb-like structure 122 having a plurality of arms 123. Attached to the separate arms 123 on the comb 122, are load beams or load springs 124. Load beams or load springs are also referred to as suspensions. Attached at the end of each load spring 124 is a slider 126 which carries a magnetic transducer 150. In some embodiments transducer 150 includes an electromagnetic coil write head 101 and a magneto-resistive read head 103. The slider 126 with the transducer 150 form what is many times called the head. It should be noted that many sliders have one transducer 150 and that is what is shown in the figures. It should also be noted that this invention is equally applicable to sliders having more than one transducer, such as what is referred to as a MR or giant magneto-resistive head in which one transducer 150 is generally used for reading and another is generally used for writing. On the end of the actuator arm assembly 120 opposite the load springs 124 and the sliders 126 is a voice coil 128.

Attached within the base 112 is a first magnet 130 and a second magnet 130'. As shown in FIG. 1, the first magnet 130 is associated with the cover 114. The first and second magnets 130, 130', and the voice coil 128 are the key components of a voice coil motor which applies a force to the actuator assembly 120 to rotate it about the actuator shaft 118. Also mounted to the base 112 is a spindle motor. The spindle motor includes a rotating portion called spindle hub 133. In this particular disc drive, tile spindle motor is within hub 133. In FIG. 1, a number of discs 134 (one or more; four are shown) are attached to the spindle hub 133 to form disc assembly 132. In other disc drives, a single disc or a different number of discs may be attached to the hub. The invention described herein is equally applicable to disc drives which have a plurality of discs as well as disc drives that have a single disc. The invention described herein is also equally applicable to disc drives with spindle motors that are within the hub 133 or under the hub.

The disc drive 100 of FIG. 1 is tested, burned-in and/or configured during manufacturing by sliding it into a test bin 90. The present invention provides the capability to quickly and efficiently test the bus connector(s) 99 in the test bin 90 and identify the type and location of any faults found. The disc drive 100 of FIG. 1 is operated by the end user during its lifetime of use by having it plugged into the bus connector(s) in the computer or information handling system. The present invention also provides the capability to test the bus connector(s) in such an end-user system, either during manufacture of the system, or in the field to repair a failed system. In particular, a socket in a RAID (redundant array of independent discs) subsystem can be tested by the present invention.

As used herein, a "socket" is defined as one part of a two-part connection system, and a "plug" is its corresponding mating part. It is to be understood that while "socket" typically denotes the female portion and "plug" typically denotes the male portion, the two can be interchanged without affecting the electrical test being performed. For convenience, the portion on the disc drive or tester will herein be referred to as the "plug" and the portion on the bus connector will be referred to as the "socket."

To test bus connector 99 in bin 90, tester system 400 (i.e., a system for testing bus connector 99) is plugged into bin 90 in place of the disc drive 100 shown. Bin 90 includes bus connector 99 and the mechanical receptacle for holding either disc drive 100 or tester system 400. Tester system 400 can be just tester 410, or in other embodiments can also include an external computer system (not shown) that records the results of multiple tests, and optionally controls a manufacturing process as a result. Bus connector 99 includes connector socket 98, bus 97, and terminator 96. In some embodiments, bus connector 99 also includes power connector socket 91 and power supply 95, either as separate connectors as shown in FIG. 1, or with the power pins of socket 91 integrated within connector socket 91. Correspondingly, power connector plug 91 can be either separate of, or integrated into signal connector plug 198 of disc drive 100, and tester power connector plug 491 can be either separate of, or integrated into signal connector plug 498 of tester 410. In the embodiment shown, tester 410 includes a display 422 on a front panel that is viewable by the user when tester 410 is plugged into bin 90. In some embodiments, the front panel also includes various user-operable controls (e.g., a power switch used to turn the unit on, a start switch used to start a test, and a mode switch used to specify whether to test for a single-ended or low-voltage differential bus).

A SCSI bus can be configured with or without a terminator. The terminator can be powered (i.e., can have voltages applied to it). Thus, some embodiments of the present invention can be configured to be able to test multiple different types of SCSI busses/sockets using a single tester device that is programmed so the user can set it to test each particular type of SCSI bus/socket.

A SCSI bus can be single-ended, standard differential (also called high-voltage differential), or low-voltage-swing differential (LVD). The tester described herein is described for an LVD SCSI bus, and also for single-ended SCSI busses. Other embodiments of the tester 410 include programming to test high-voltage differential busses. Still other embodiments of tester 410 have a mode switch used to specify whether to test for a single-ended or low-voltage differential or high-voltage differential bus. The main difference in such testers is the voltages that are expected and compared for by the tester 410.

Figure 2:
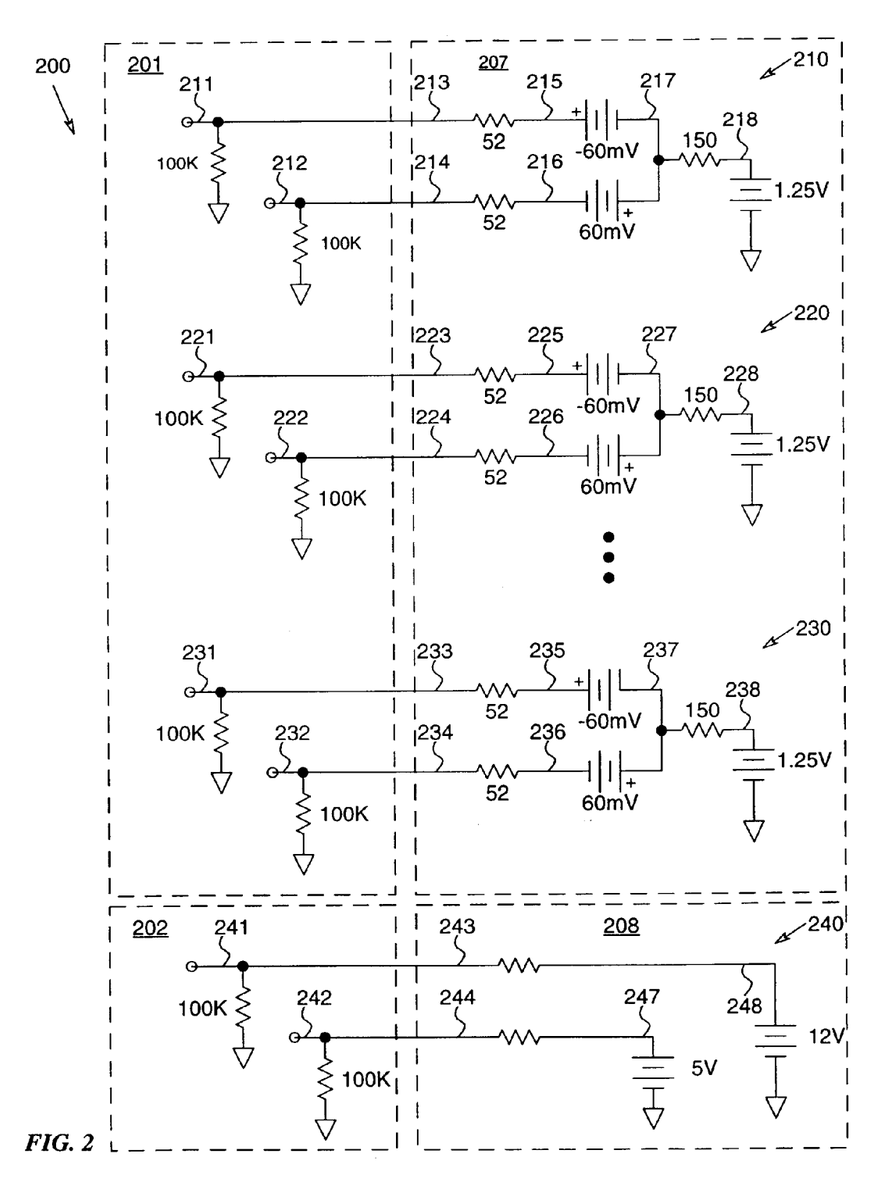
FIG. 2 is schematic diagram of a tester connection for a SCSI bin comprising differential bus connector 207.

FIG. 2 is schematic diagram of a tester connection for a SCSI bin comprising a differential bus connector 207. As used herein, a "bus connector" includes the physical connector itself along with those components, electrical connections, bus, and terminator, if any, that are electrically connected to the physical connector. In some embodiments, the power connector 208 is also tested, wherein power connector 208 can be either a separate physical connector, or can be physically integrated with bus connector 207. Similarly, the first electrical connector 201 of tester system 400 (see also FIG. 4) is implemented in various embodiments as either a separate physical connector, or can be physically integrated with the second electrical connector 202 of tester system 400.

For each bit position 210, 220, . . . 230 a similar electrical termination is provided. For example, for differential bit position 210, the circuit can be represented by the plus-bit pin 213 connected through a 52-ohm resistor in series with a minus 60-millivolt voltage change to a common node 217, the minus-bit pin 214 connected through a 52-ohm resistor in series with a plus 60-millivolt voltage change to the common node 217 (thus from pin 213 to node 217 the voltage drops about 0.06 volts, and from node 217 to pin 214 the voltage drops 0.06 volts), and the common node 217 connected though a 150-ohm resistor in series with a 1.25-volt electrical source connected to ground. The other differential bit positions 220 though 230 are similarly wired. In some exemplary embodiments, 8, 16, or 32 such differential bit positions are provided.

In some embodiments, a separate power connector 208 is provided, while in other embodiments, the power supply pins 243 and 244 are integrated as part of (or within) a unitary connector 207. The corresponding power-test connector 202 is then separate (e.g., unit 202 of FIG. 2) or integrated as part of a unitary first electrical connector 201. In some embodiments, these are dictated by the type of SCSI bus connector that is being tested.

The tester's first electrical connector 201 is plugged into bus connector 207. If all the pins 211, 212, 221, 222, . . . 231, 232 are left floating by the tester (i.e., not connected to a voltage source within tester system 400), and the bus connector 207 being tested is wired as shown, then all of the pins 211, 212, 221, 222, . . . 231, 232 will have about the same measured voltage, i.e., about 1.25V−0.06V=1.19 volts (the voltage drop across the 150-ohm and 52-ohm resisters will be negligible if the tester internal resistance is about 1000 K ohms, or perhaps 0.004 volts if the tester internal resistance is about 100 K ohms, yielding a measure voltage of 1.186 volts). In one embodiment, tester system 400 will sequentially connect each one of the pins 211, 212, 221, 222, . . . 231, 232 to a 16-bit analog-to-digital converter (ADC) circuit using a first analog multiplexor, and the microprocessor will read the resulting 16-bit digital value corresponding to each measured voltage. If each pin tested is within a predetermined tolerance of the expected voltage (i.e., 1.19 volts in this case), then the connector passes this test. If, on the other hand, a zero voltage is read on one or more of the pins, then that connection is "shorted to ground" (shorted), and the microprocessor will identify the failing pin(s) by their location, and indicate that an shorted fault was detected. However, if a high voltage is detected, then that pin is "open" (not connected), that floating pin leading to a high voltage read by the A/D converter, and the microprocessor will indicate that an open fault was detected for that pin.

Because of the terminator and the 100 K ohm tester resistances, with no faults, then:

node 222 and pin 224 will have a voltage of about 1.19 volts, node 226 will have a voltage of about 1.19 volts, node 227 will have a voltage of about 1.25 volts, node 228 will have a voltage of about 1.25 volts, node 225 will have a voltage of about 1.31 volts, and pin 223 and node 221 will have a voltage of about 1.31 volts.

If pin 223 of the bus connector 207 is shorted to ground, then:

node 221 and pin 223 will have a voltage of 0 volts, node 225 will have a voltage of about 0.30 volts, node 227 will have a voltage of about 0.24 volts, node 228 will have a voltage of about 1.250 volts, node 226 will have a voltage of about 0.18 volts, and pin 224 and node 222 will have a voltage of about 0.18 volts.

The following Table 1 identifies a series of test conditions, possible faults, and the resulting voltages on other pins. Note: In this table, 1000 K ohm tester resistances are assumed. If 100 K ohm resistances are assumed, then each 1.19-volt reading shown will be 1.186 volts instead. The voltage-measuring points 211, 212, 221, 222, 231, and 232 are on the first connector 498 of tester system 400—see FIG. 4—while the possible faults (i.e., pins 213, 214, 223, 224, 233, and 234) are in the bus connector 98 being tested. In some embodiments, one or more predetermined tolerance amounts is specified for one or more of the comparisons to be made using the values of Table 1, in order to define an acceptable no-fault range, and in order to properly identify and locate the various fault conditions.

measured (this output pin is called the B-pin herein), and every pin is measured sequentially).

In some embodiments, the tester's power-test connector 202 is plugged into power connector 208 for power-supply tests. Power supply connector 208 can have one or more pins for each of one or more voltages. In this test, two power supply pins are provided: pin 243 providing the 12-volt supply, and pin 244 providing the 5-volt supply. If all the pins 243–244 are left floating by the tester (i.e., not connected to a load or voltage source within tester 410), and the power connector 208 being tested is wired as shown (the internal power supply resistances are negligible), then tester pin 241 will measure a no-load voltage of about 12 volts, and tester pin 242 will measure a no-load voltage of about 5 volts. In some embodiments, a tolerance is specified for the allowable variance of these no-load values.

In some embodiments, an electrical load is then applied to pin 241 and/or pins 242, to simulate the load that would be provided by a disc drive or other device that is plugged into socket 208. In some such embodiments, the LED display unit within the tester 410 is used as this electrical load. Then tester pin 241 will measure a loaded voltage of 12 volts, and tester pin 242 will measure a loaded voltage of about 5 volts. The actual "loaded" measurements will typically be lower than the corresponding no-load voltages due to drops across the internal resistances in the power supply. If the internal power-supply resistances arc too high, the resulting internal voltage drops (or if there is some other fault, that fault) will cause the measured voltages to pin 241 and/or pins 242 to be out-of-specification, and a fault will be indicated by the tester 410. In some embodiments, the actual measured voltages are displayed. In some embodiments, a tolerance is specified for the allowable variance of these loaded values.

A test used for some embodiments drives a voltage (for example, 4.0 volts) through a resistance (for example 170 ohms) into one pin, and reads the resulting voltage of all the other pins. That is, the pin input voltage is at one terminal

TABLE 1

| | No input drive signal used, all pins almost floating (1000 KΩ to GND). | | | | | |
|---|---|---|---|---|---|---|
| Open Fault or Grounded Fault detected: | point 211 | point 212 | point 221 | point 222 | point 231 | point 232 |
| no fault (good bus connector) | 1.31 V | 1.19 V | 1.31 V | 1.19 V | 1.31 V | 1.19 V |
| openfault: pin 213 open | 8 V* | 1.19 V | 1.31 V | 1.19 V | 1.31 V | 1.19 V |
| openfault: pin 214 open | 1.31 V | 8 V* | 1.31 V | 1.19 V | 1.31 V | 1.19 V |
| openfault: pin 223 open | 1.31 V | 1.19 V | 8 V* | 1.19 V | 1.31 V | 1.19 V |
| openfault: pin 224 open | 1.31 V | 1.19 V | 1.31 V | 8 V* | 1.31 V | 1.19 V |
| openfault: pin 233 open | 1.31 V | 1.19 V | 1.31 V | 1.19 V | 8 V* | 1.19 V |
| openfault: pin 234 open | 1.31 V | 1.19 V | 1.31 V | 1.19 V | 1.31 V | 8 V* |
| Grounded fault: pin 223 shorted to ground | 1.31 V | 1.19 V | 0 V | 0.306 V | 1.31 V | 1.19 V |

*Note:
In some embodiments, an op-amp having an offset bias is placed on the input of the A/D converter 442, such that when an open or floating pin is detected, a high voltage (such as 8 volts) is indicated. In such an embodiment, the triangle symbols connected to lower terminal of the 100 K ohm resistors at the left of FIG. 2 represent an 8-volt signal, and the triangles at the right connected to lower terminals of the 1.25-volt, the 5-volt, and the 12-volt voltage sources represent ground.

In some of the following embodiments, only a subset of other pins, for example the nearest pins on either side of the input pin, are measured, since it is likely that shorts, if they occur, will occur to those pins. In other embodiments, each one of a plurality of input voltages (passed first through a series resister in tester 410) is applied to each pin (i.e., to one pin at a time (this input pin is called the A-pin herein), and to every pin sequentially) of bus connector 98. For each input voltage to each A-pin, tester 410 measures a resulting voltage on every pin of bus connector 98 (or on every pin except the A-pin) (i.e., the voltage of one pin at a time is of a 170-ohm resistor, the other terminal of which is connected to 4.0 volts. If, for a "good" bus connector 98 having no shorts and no opens, all but one of the pins 211, 212, 221, 222, . . . 231, 232 are left almost floating by the tester (i.e., connected to ground through 100 K ohms resisters within tester 410), and that remaining pin (for example, pin 222) is connected to 4 volts through a resistance of 170 ohms, and the bus connector 207 being tested is wired as shown, then all of the pins 211, 212, . . . 231, 232 will have about the same voltage, i.e., 1.25V−0.064V=1.186 volts. The 4-volt input signal used is higher that other signals that could be used, in order to obtain readily discernable measurable results for the various good and fault conditions possible.

Because of the 4 volt drive signal, and the 170-ohm drive resistance, the no-fault condition of FIG. 2 will provide the following analysis:

node 224 will have a voltage of about 2.714 volts, node 226 will have a voltage of about 2.321 volts, node 227 will have a voltage of about 2.381 volts, node 228 will have a voltage of about 1.250 volts, node 225 will have a voltage of about 2.321 volts, and node 221 will have a voltage of about 2.320 volts.

In one embodiment, tester 400 will sequentially connect each one of the pins 211, 212, 221, 222, . . . 231, 232 to a 16-bit analog-to-digital converter (ADC) circuit using the first analog multiplexor, and the microprocessor will read the resulting 16-bit digital value corresponding to each measured voltage. If each pin tested is within a predetermined tolerance of the expected voltage (i.e., 1.186 volts for the other bits not being driven in this case), then the connector passes this test. If, on the other hand, a different voltage is read on one or more of the pins, then that connection is "shorted" (erroneously connected to some other pin or voltage), and the microprocessor will identify the failing pin(s) by their location, and indicate that a shorted fault was detected. In some embodiments, a data structure 680 (see FIG. 6) including values corresponding to Table 2 is provided.

There are five faults detected: the other line of the bit line being driven shorted to the plus or minus line of another bit, the other line of the bit line being driven shorted to the bit line being driven, and the bit line being driven shorted to the plus or minus line of another bit. The following Table 2 identifies a series of test conditions, possible faults, and the resulting voltages on other pins for one embodiment. In other embodiments, other input voltage(s) are used, and other output voltage results are obtained from the various faults. The voltage-measuring points 211, 212, 221, 222, 231, and 232 of Table 2 are on the first connector 498 of tester 400—see FIG. 4—while the possible faults (i.e., pins 213, 214, 223, 224, 233, and 234) are in the bus connector 98 being tested.

Yet another test used for some embodiments drives another voltage (for example 0.0 volts) through a resistance (for example 170 ohms) into one pin, and reads the resulting voltage of all the other pins. That is, the input voltage is at one terminal of a 170-ohm resistor, the other terminal of which is grounded. If all but one of the pins 211, 212, 221, 222, . . . 231, 232 are left almost floating by the tester (i.e., connected to ground through 100K ohms resisters within tester 400), and that remaining pin (for example, pin 222) is connected to 0.0 volts through a resistance of 170ohms, and the bus connector 207 being tested is wired as shown, then all of the pins 211, 212, . . . 231, 232 will have about the same voltage, i.e., 1.25V−0.064V=1.186 volts. Because of the 0.0 volt drive signal, and the 170-ohm drive resistance, we should get the following:

node 224 will have a voltage of about 0.54333 volts, node 226 will have a voltage of about 0.70953 volts, node 227 will have a voltage of about 0.76953 volts, node 228 will have a voltage of about 1.250 volts, node 225 will have a voltage of about 0.70953 volts, and node 221 will have a voltage of about 0.70916 volts.

If each pin tested is within a predetermined tolerance of the expected voltage (i.e., 1.186 volts for the other bits not being driven in this case), then the connector passes this test. If, on the other hand, a different voltage is read on one or more of the pins, then that connection is "shorted" (erroneously connected to some other pin or voltage), and the microprocessor will identify the failing pin(s) by their location, and indicate that a shorted fault was detected. In one embodiment, there are four faults detected: the other line of the bit line being driven shorted to the plus or minus line of another bit, the other line of the bit line being driven shorted to the bit line being driven, and the bit line being driven shorted to the plus or minus line of another bit. The following Table 3 identifies a series of test conditions, possible shorting faults, and the resulting voltages on other pins for one embodiment.

TABLE 2

Drive from tester: pin 222 connected to 170 Ω/4 volts, other pins almost floating (100 KΩ to GND).

| Shorting Fault detected | point 211 | point 212 | point 221 | point 222 | point 231 | point 232 |
|---|---|---|---|---|---|---|
| no fault (good bus connector) | 1.186 V | 1.186 V | 2.320 V | 2.714 V | 1.186 V | 1.186 V |
| fault: pin 213 shorted to pin 223 | 1.852 V | 1.680 V | 1.852 V | 2.488 V | 1.186 V | 1.186 V |
| fault: pin 214 shorted to pin 223 | 1.680 V | 1.852 V | 1.852 V | 2.488 V | 1.186 V | 1.186 V |
| fault: pin 224 shorted to pin 223 | 1.186 V | 1.186 V | 2.617 V | 2.617 V | 1.186 V | 1.186 V |
| fault: pin 224 shorted to pin 234 | 1.186 V | 1.186 V | 1.964 V | 2.234 V | 1.964 V | 2.234 V |
| fault: pin 224 shorted to pin 233 | 1.186 V | 1.186 V | 1.964 V | 2.234 V | 2.234 V | 1.964 V |

TABLE 3

Drive from tester: input pin 222 connected to 170 Ω/0.0 volts, other pins almost floating (100 KΩ to GND).

| Shorting Fault detected | point 211 | point 212 | point 221 | point 222 | point 231 | point 232 |
|---|---|---|---|---|---|---|
| no fault (good bus connector) | 1.186 V | 1.186 V | 0.709 V | 0.543 V | 1.186 V | 1.186 V |
| fault: pin 213 shorted to pin 223 | 0.905 V | 0.978 V | 0.905 V | 0.638 V | 1.186 V | 1.186 V |
| fault: pin 214 shorted to pin 223 | 0.978 V | 0.905 V | 0.905 V | 0.638 V | 1.186 V | 1.186 V |
| fault: pin 224 shorted to pin 234 | 1.186 V | 1.186 V | 0.858 V | 0.745 V | 0.745 V | 0.858 V |
| fault: pin 224 shorted to pin 233 | 1.186 V | 1.186 V | 0.858 V | 0.745 V | 0.858 V | 0.745 V |

In some embodiments, a data structure 680 (made up of one or more separate parts) is provided, specifying comparison values for the ADC digital output values, wherein the comparison values correspond to the voltages shown in Tables 1, 2, and/or 3, and specifying information identifying the type and location of the detected faults. In some embodiments, data structure 680 also provides information specifying which pins and the order of pins to be used as input pins (A-pins), which voltages and the order of voltages to be used as input voltages, and each of the no-fault and fault conditions that can be detected, along with the expected output voltages for each of the output pins (B-pins). As can be seen from the tables above, in some embodiments, the A-pin (e.g., pin 222) is also measured as a B-pin (measurement point 222) to see the voltage on it resulting from the various drive conditions.

Figure 3:
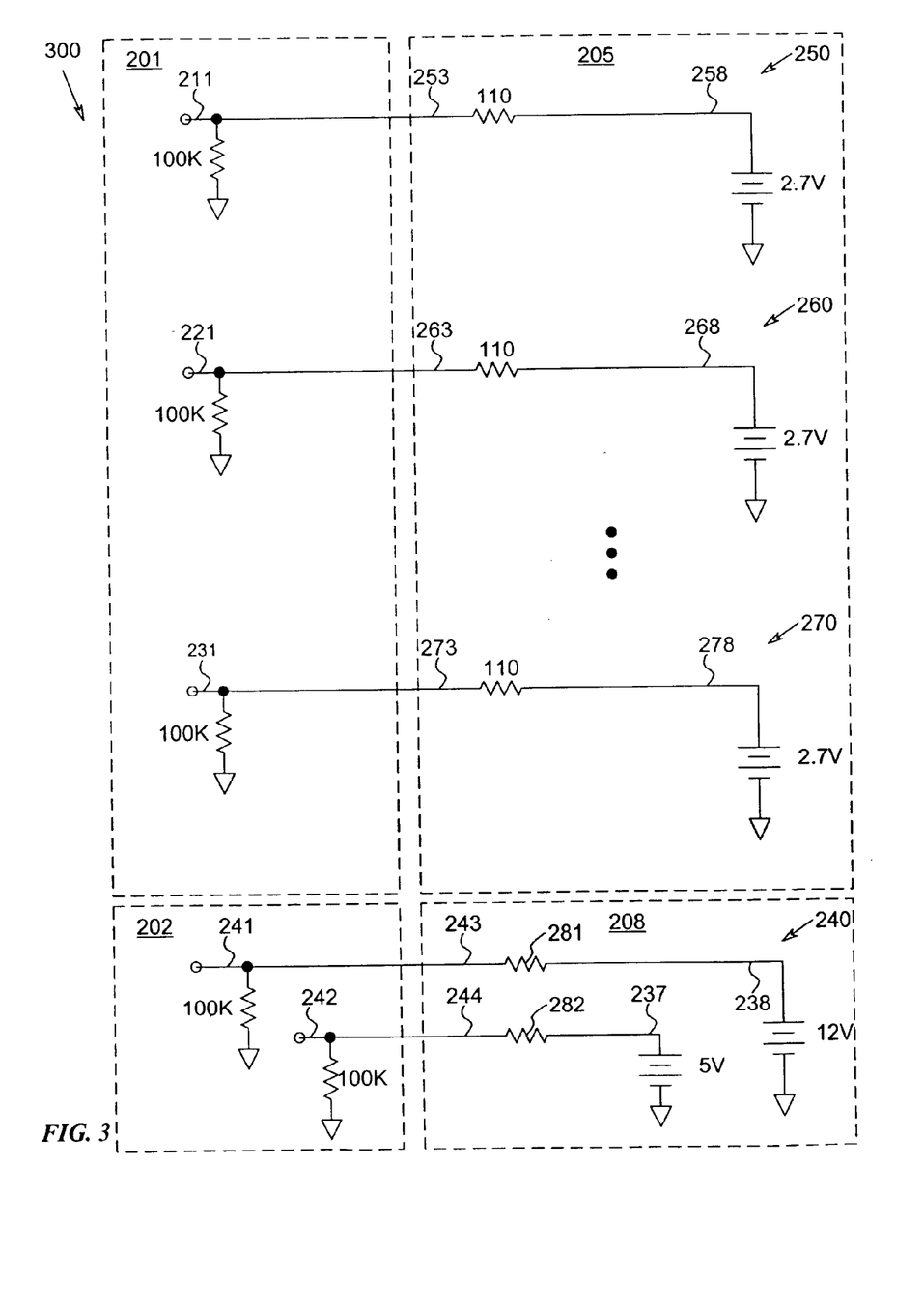
FIG. 3 is schematic diagram of a tester connection for a SCSI bin comprising single-ended bus connector 205.

FIG. 3 is schematic diagram of a tester connection for a SCSI bin comprising single-ended bus connector 205. Each single-ended bit position is represented by a 110-ohm resistor in series with a 2.7-volt electrical source connected to ground.

Some embodiments use the same tester 400 for testing both differential bus connectors such as shown in FIG. 2 as well as single-ended bus connectors such as shown in FIG. 3. The tester 400 is programmed differently for each type (the user can set the tester 400 for one "mode" or the other), the tester's program using test procedures, test voltages, input pin connections and output pin measurements that are settable to one or the other connector type. For example, in single-ended mode, with the almost floating connection shown in FIG. 3, pins 211, 221, . . . 231 should all measure about 2.7 volts (no-fault condition). If one of the bus connector pins (253, 263, . . . or 273) is shorted to 5 volts, the corresponding tester pin (211, 221, . . . or 231) will measure about 5 volts. If one of the bus connector pins (253, 263, . . . or 273) is shorted to ground (or is open), the corresponding tester pin (211, 221, . . . or 231) will measure about 0 volts.

With a 110 ohm load (connected in series to ground inside tester 400) connected to pin 221, the voltage measured at pin 221 should be about 1.35 volts (the 2.7 volt source in bus connector 205 being divided between the 110-ohm resistor in bus connector 205 and the 110 ohm load inside tester 400), and the voltage at the other bit positions 211–231 should all be about 2.7 volts since there is no load on those pins. If there is a fault that shorts pin 253 to pin 263, the voltage measured at pin 221 and at pin 211 will each be about 1.80 volts (the two 110-ohm resistor in bus connector 205 being in parallel provide an equivalent 55-ohm internal resistance, with the tester resistance remaining at 110 ohms).

Thus the above description for FIGS. 2 and 3 provide numerous tests that can be performed to distinguish various shorts between pins, shorts to power or ground, and opens. Misconnected pins can also be detected in differential connectors, since the negative-logic pin of a bit position is supposed to be affected in a known manner by applying a voltage to its positive-logic pin.

Figure 4:
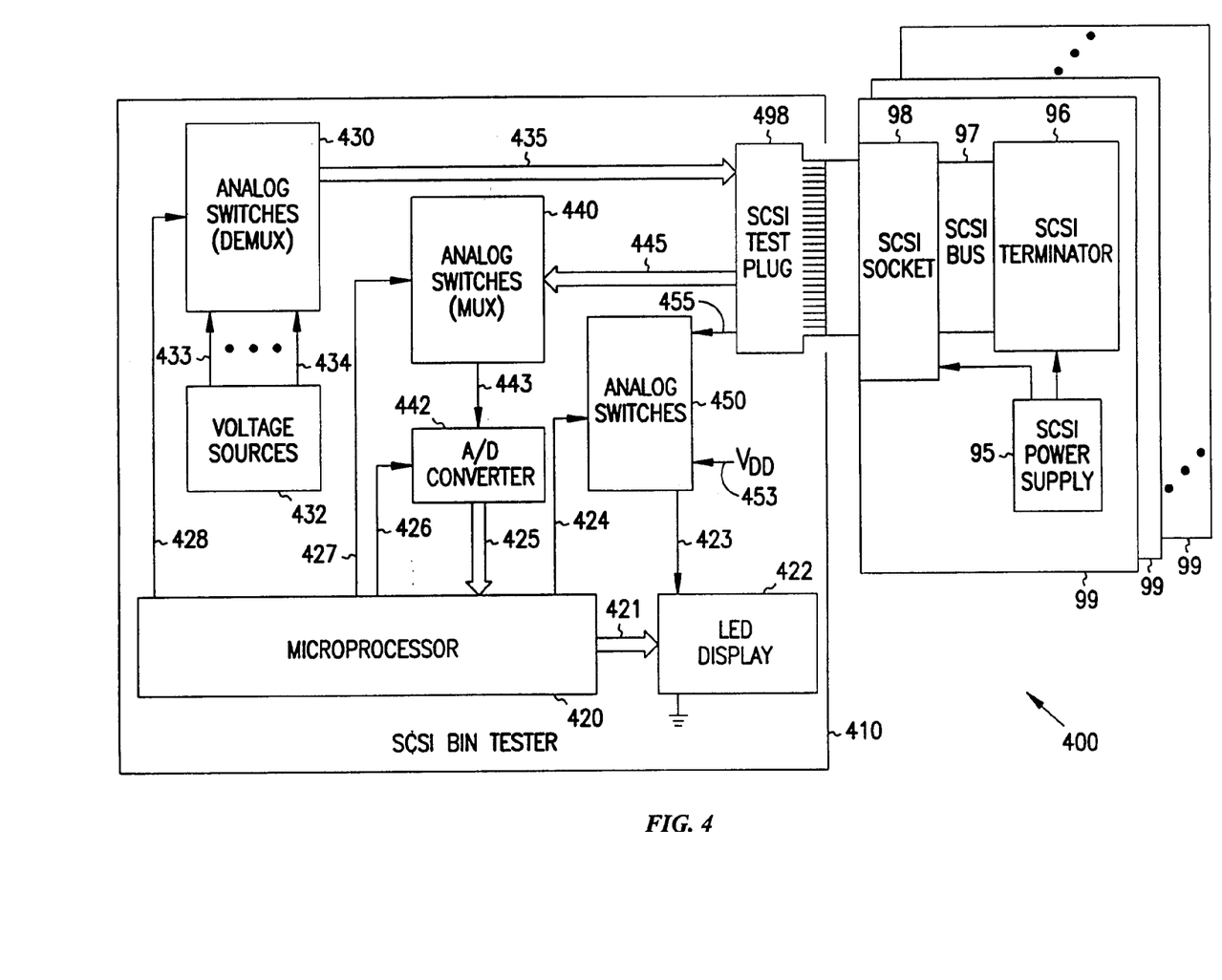
FIG. 4 is a block diagram of a smart tester system 400.

FIG. 4 is a block diagram of a smart tester system 400. Tester system 400 includes a tester 410 plugged into a bus connector 99. Some embodiments of tester system 400 also include an external computer system (not shown) and/or other equipment coupled to tester 410 to control and gather results from a plurality of tests. In some embodiments, there are multiple bus connectors 99 to be tested, and tester 410 is plugged into each one sequentially (either manually or under the control of a robotic machine). In some embodiments, there are a plurality of bins 90, each having a bus connector 99 therein, and tester 410 (called a SCSI bin tester) is sized and shaped to be manually inserted into each bin. When the test is complete, the display 422 so indicates, and also indicates whether there is no fault detected, or if a fault is detected, which type of fault and the location of the fault is indicated on an LED display (e.g., an indication of a short fault, and a specification of which two pins are shorted). In some embodiments, display 422 is omitted, and instead the output 421 of microprocessor 420 is an electrical signal to an external computer system (for example, a robotically enabled system that automatically tests numerous bus connectors 99 by robotically plugging tester 410 into one after another bus connectors 99, and reporting the results 421 to the external computer system).

In the embodiment shown in FIG. 4, tester 410 is a SCSI bin tester, manually plugged into each bin 90 (see FIG. 1) to be tested. Tester 410 includes microprocessor 420 which, using signal 428, controls analog switches 430 (also called an analog demultiplexor, or demux 430) to select (as its input drive signal) one (or in other cases, none) of the one or more voltage signals 433–434 from voltage sources 432, and to connect that selected drive signal (or in the other cases, no signal) to one of the pins of tester plug 498 (in one embodiment, a SCSI plug). The selected voltage source and/or the analog demux 430 also provide an internal resistance (i.e., internal to tester 410) in series with the voltage source, to obtain the drive signal. Because of the voltage drop across the internal resistance and the circuit interactions within bus connector 99, the voltage as measured at various of the pins of connector 498 is used to deduce circuit conditions (e.g., faults) within bus connector 99. Thus, while providing the above drive signal conditions, microprocessor 420 uses signal 427 to control analog multiplexor (mux) 440 to connect each one of the pins of tester plug 498 to analog-digital converter (ADC) 442, one at a time. For each output pin whose voltage is to be measured, ADC 442 (as controlled by convert-command signal 426) provides a digital value on bus 425 to microprocessor 420. Note that in some embodiments, all of the pins of plug 498 are connected as input pins (also called A-pins) which provide drive signals into bus connector 99, and as output pins (also called B-pins) which receive resulting signals from bus connector 99. Thus, for each signal provided to an A-pin, a set of digital values is received and stored in microprocessor 420 representing the resulting voltages on a plurality of B-pins. This set of digital values is then used to determine whether there is a fault, and if so, the type and location of the fault, based on a data structure having information such as shown in Tables 1, 2, and/or 3 above.

In some embodiments, an analog switch 450 selectively connects LED display 422 (or some other suitable load) to the power-supply signal 455, and the resulting power supply voltage is connected (as a B-pin) using analog mux 440 to the ADC 442 to provide digital values representing the no-load voltage and/or the loaded voltage of one or more of the output voltages of power supply 95 as output at connector 98. In some embodiments, after this power-supply test is complete, analog switch 450 disconnects signal 455 and reconnects LED display 422 to its normal $V_{DD}$ supply 453.

Figure 5:
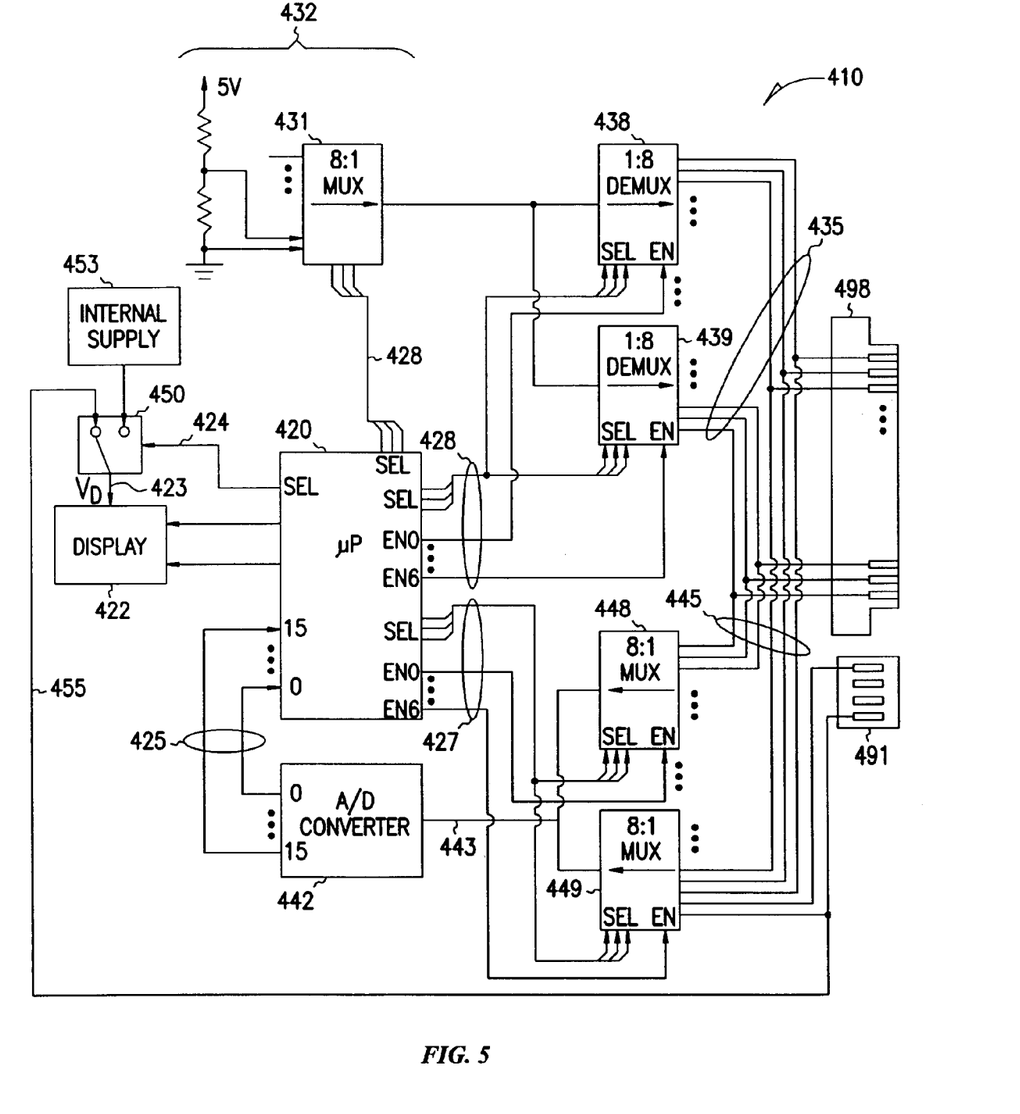
FIG. 5 is a block diagram showing more detail of one embodiment of tester 410.

FIG. 5 is a block diagram showing more detail of one embodiment of tester 410. In this embodiment, voltage sources 432 includes a resistor-divider network coupled to a 5-volt supply in order to provide a 4-volt signal and a 0-volt signal, each as inputs to 8:1 mux 431. In some embodiments, other voltage inputs to mux 431 are provided as well (for example, from one or more voltage regulators that provide the additional or alternative desired voltage(s)). Mux 431 is controlled by signals 428 from processor 420, which select and enable zero or one of the voltage inputs to be connected to the output of mux 431. The output of mux 431 is provided as an input to each one of a plurality of 1:8 demux circuits 438–439, which together form demux 430. In one embodiment, seven such demux circuits 438–439 are used.

Figure 6:
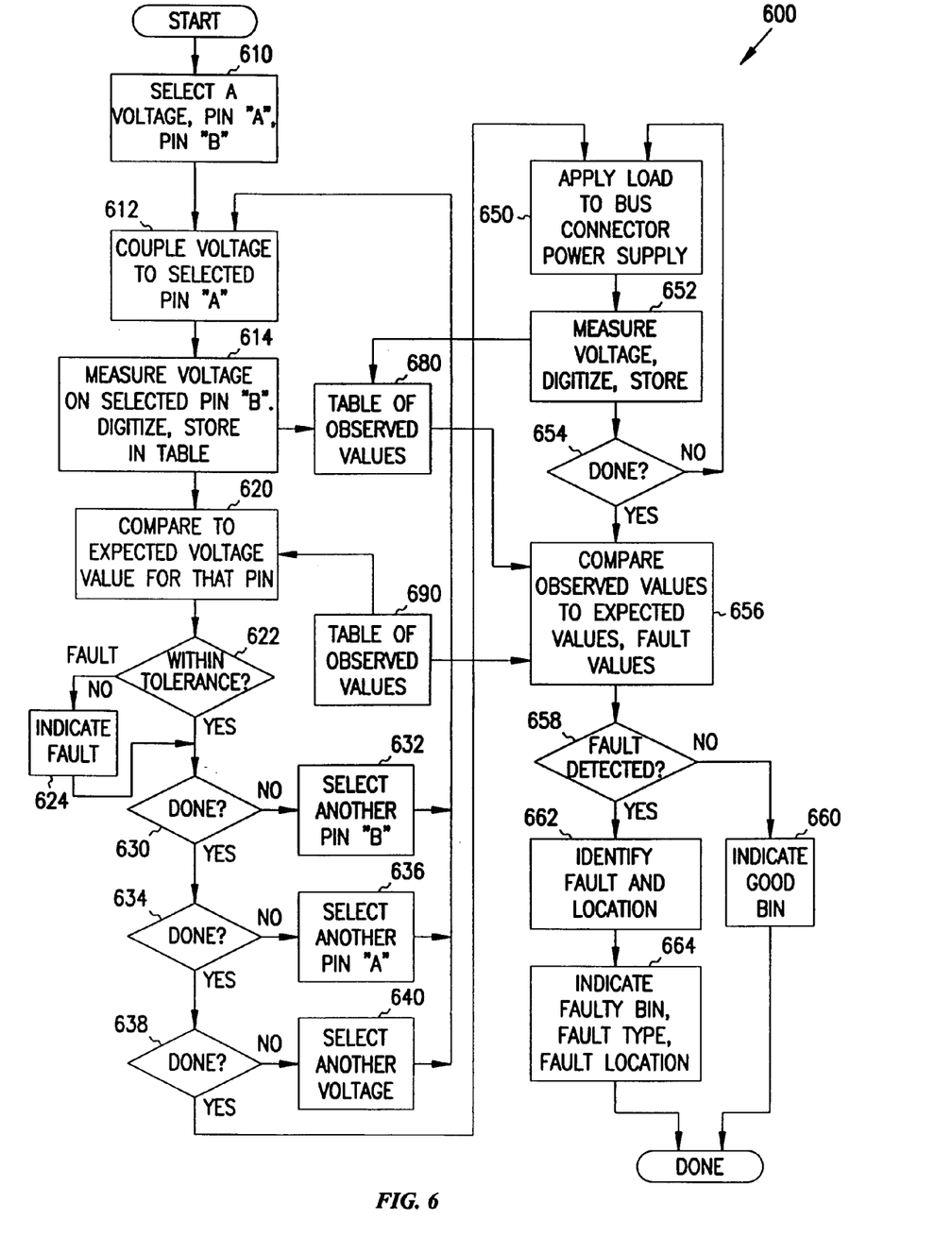
FIG. 6 is a flowchart of one method used in one embodiment of the present invention.

FIG. 6 is a flowchart of one method used in one embodiment of the present invention. At block 610, the automatic tester 410 selects a voltage from one or more voltages (e.g., using mux 431), selects a pin (called the A-pin) to which to apply the selected voltage (e.g., using demux 430), and selects a pin (called the B-pin) from which to measure the resulting voltage (e.g., using mux 440), At block 612, the selected voltage is coupled to the A-pin (e.g., by turning on the appropriate enable signals of signal 428). At block 614, the resulting voltage from the selected B-pin is measured and digitized, and in some embodiments, is stored into a table 680 of observed values. In some embodiments, blocks 620, 622, and 624 are not performed. On other embodiments, block 620 compares the measured value of block 614 to an expected value of the voltage of that measurement (note that the measure/expected values can be binary values having a scale that, in some embodiments, is volts, but in other embodiments, is another suitable scale); block 624 determines whether the comparison is within a tolerance specified for the measurement (e.g., by rounding or truncating the result of a 16-bit subtraction of the two values to a suitable number of bits); and at block 624, if a fault is detected, an indication is output (e.g., displayed or inserted into a table). At block 630, a test is performed, where if all the desired B-pins are not measured, a branch to block 632 is taken to select another pin us the next B-pin to measure. At block 634, a test is performed, where if all the desired A-pins are not tested, a branch to block 636 is taken to select another pin as the next A-pin to output to. At block 638, a test is performed, where if all the desired output voltages have not been tried, a branch to block 640 is taken to select another input voltage as the next voltage to send to the A-pins. Note, in other embodiments, the tests 630, 632, or 634 are performed in other orders than that shown. Once the yes branch of the last of these tests is taken, the process goes to optional blocks 650, 652, and 654 since all desired combinations of input voltages, A-pins, and B-pins have been tested. In embodiments that perform blocks 650, 652, and 654, they can be performed before, after, or between the other tests. In the embodiment shown, after the wiring tests 610–640 are performed, the power supply of the bus connector 99 is tested, wherein at block 650 a load (such as connecting the display of the tester as a power-supply load) is applied to one of the one or more power supply pins (e.g., see switch 650 of FIG. 5); block 652 measures, digitizes, and stores the digital value representing the resulting voltage; and block 654 determines whether all the desired loads and/or power supply pins have been tested. In some embodiments, a zero-load is one of the "loads" used (i.e., no load is connected), in order to test the no-load output voltage of the power supply 95. At block 656 a comparison is made of the value or values in table 680 to the expected value or values in table 690. In some embodiments, one set of values of table 680 is compared to a plurality of sets of values in table 690, in order to effect a comparison such as exemplified in Tables 1, 2, and/or 3 described above, in order to determine exactly which pins are open or shorted, and to determine the exact location of the fault. In some embodiments, the location of the fault is part of the data structure of table 690. If at block 658, a fault is determined to have occurred, blocks 662 and 664 identify and indicate (e.g., by a visual display or an electronic signal to a central data-gathering computer) the fault type and/or fault location. If no fault has been detected, a good completion of the tests is indicated at block 660.

Conclusion

Described above is a method and apparatus for testing a set of one or more bus connectors.

One aspect of the present invention provides a system 400 for testing a bus connector includes a microprocessor, a first analog multiplexor and an analog demultiplexor both coupled to a first electrical connector, an analog-to-digital converter (ADC) circuit, and a voltage source. The first analog multiplexor is operatively coupled to be controlled by the microprocessor, receiving input from the first electrical connector. The analog-to-digital converter (ADC) circuit is operatively coupled to receive an analog signal from the first analog multiplexor and to provide to the microprocessor a digital signal representative of a voltage on the first electrical connector. The first electrical connector has a plurality of connection pins suitable for connection to the bus connector, and is operatively coupled to provide inputs to the first analog multiplexor. The analog demultiplexor is operatively coupled to be controlled by the microprocessor, and has a plurality of analog output connections operatively coupled to the first electrical connector. The voltage source operatively coupled to provide at least one predetermined voltage as an input to the analog demultiplexor. Such a system allows the bus connector to be tested for shorted faults and opened faults.

In some embodiments of the system 400, the microprocessor controls the system to serially apply the at least one predetermined voltage signal to one pin of the bus connector at a time, and then to test each one of a plurality of the other pins to determine whether the applied voltage does travel to the other pins to which the signal should go and does not travel to the other pins to which the signal should not go.

In some embodiments of the system 400, the voltage source provides a plurality of voltages. In some of these embodiments, a second analog multiplexor is operatively coupled to be controlled by the microprocessor, and operatively coupled to receive the plurality of voltages from the voltage source, and operatively coupled to provide an output signal to an input of the analog demultiplexor. This allows each one of a plurality of different voltages to be used as the input voltage signal.

In some embodiments of the system 400, the microprocessor at a first time (or clock period, wherein "first" here does not necessarily denote a temporal sequence, but rather is merely a name indicating a particular moment of time or clock period as distinguished form other moments of time or clock periods named "second" or "third" etc.) controls the second analog multiplexor and the analog demultiplexor to operatively couple a first one of the plurality of voltages to a first one of the connection pins, and controls the first analog multiplexor to operatively couple a second one of the connection pins to the ADC circuit, in order to receive into the microprocessor a digital value from the ADC circuit representative of the voltage on the second pin that resulted from applying the first voltage to the first pin. This allows the received digital value to be tested to determine whether the connection or interaction between the first pin and the second pin is as expected.

In some embodiments of the system 400, the microprocessor at a second time (or clock period controls the second analog multiplexor and the analog demultiplexor to operatively couple the first one of the plurality of voltages to a third one of the connection pins, and controls the first analog multiplexor to operatively couple a fourth one of the connection pins to the ADC circuit, in order to receive into the microprocessor a digital value from the ADC circuit representative of the voltage on the fourth pin that resulted from applying the first voltage to the third pin.

In some embodiments of the system 400, the microprocessor at a third time (or clock period) controls the second analog multiplexor and the analog demultiplexor to operatively couple a second one of the plurality of voltages to a first one of the connection pins, and controls the first analog multiplexor to operatively couple a second one of the connection pins to the ADC circuit, in order to receive into the microprocessor a digital value from the ADC circuit representative of the voltage on the second pin that resulted from applying the second voltage to the first pin.

In some embodiments of the system 400, the microprocessor at a fourth time (or clock period)controls the second analog multiplexor and the analog demultiplexor to operatively couple a second one of the plurality of voltages to a first one of the connection pins, and controls the first analog multiplexor to operatively couple a second one of the connection pins to the ADC circuit, in order to receive into the microprocessor a digital value from the ADC circuit representative of the voltage on the second pin that resulted from applying the second voltage to the first pin.

Some embodiments of the system 400 further include a second electrical connector, an electrical load, and an electronically controlled switch. The second electrical connector includes a plurality of connection pins suitable for connection to a power-supply connector, and is operatively coupled to provide inputs to the first analog multiplexor. The electronically controlled switch is operatively coupled to be controlled by the microprocessor, and is operable to selectively connect the electrical load to the second electrical connector. The second electrical connector is operatively coupled to provide one or more inputs to the first analog multiplexor. The microprocessor at a fifth time (or clock period) controls the electronically controlled switch to operatively couple a pin of the second electrical connector to the electrical load, and controls the first analog multiplexor to operatively couple the pin of the second electrical connector to the ADC circuit, in order to receive into the microprocessor a digital value from the ADC circuit representative of the voltage on the pin of the second electrical connector that resulted from operatively coupling the pin of the second electrical connector to the electrical load.

Some embodiments of the system 400 further include a second electrical connector, an output display, an internal power supply, and an electronically controlled switch. The second electrical connector includes a plurality of connection pins suitable for connection to a power-supply connector, and is operatively coupled to provide inputs to the first analog multiplexor. The electronically controlled switch is operatively coupled to be controlled by the microprocessor, and includes a first input operatively coupled to receive power from the internal power supply, a second input operatively coupled to receive power from the second electrical connector, and an output operatively coupled to provide power to the output display such that at various times either the internal power supply or the second electrical connector provides power to run the output display.

In some embodiments of the system 400, the second electrical connector is operatively coupled to provide one or more inputs to the first analog multiplexor. The microprocessor at a sixth time (or clock period) controls the electronically controlled switch to operatively couple a pin of the second electrical connector to the output display, and controls the first analog multiplexor to operatively couple the pin of the second electrical connector to the ADC circuit, in order to receive into the microprocessor a digital value from the ADC circuit representative of the voltage on the pin of the second electrical connector that resulted from operatively coupling the pin of the second electrical connector to the output display.

Another aspect of the present invention provides a method 600 for testing a bus connector including a plurality of connection pins. The method includes steps 610 selecting a first test input voltage, 612 automatically controlling a coupling of the first test input voltage to a first one of the connection pins, 614 measuring a voltage of a second one of the connection pins and generating a first digital value representative of the voltage on the second pin that resulted from applying the first voltage to the first pin, 656 automatically comparing the first digital value to a predetermined first expected value, and 660, 664 providing an output indication based on the comparing step 656.

Some embodiments of the method 600 further include iteratively performing steps 610, 612, and 614, and step 656 substituting each of a plurality of other pins for the first pin in the controlling step 612 and substituting each of a plurality of other pins for the second pin in measuring step 614, and wherein the step 660, 664 of providing the indication is further based on each of the comparing steps 656.

In some embodiments of the method 600, the step 610 of selecting further includes selecting a voltage from a plurality of predetermined voltages.

In some embodiments of the method 600, the step 610 of selecting further includes 610 selecting a first voltage from a plurality of predetermined voltages for a first plurality of iterations, and 640 selecting a second voltage from the plurality of predetermined voltages for a second plurality of iterations.

Some embodiments of the method 600 further include (g) selecting a second test input voltage, (h) automatically controlling a coupling of the first test input voltage to the first one of the connection pins, (i) measuring a voltage of the second one of the connection pins, (j) generating a second digital value representative of the voltage on the second pin that resulted from applying the second voltage to the first pin, and (k) automatically comparing the second digital value to a predetermined second expected value, wherein the step (f) of providing the indication is further based on the comparing step (k).

Some embodiments of the method 600 further include (l) automatically controlling a coupling of the first test input voltage to a third one of the connection pins, (m) measuring a voltage of a fourth one of the connection pins, (n) generating a third digital value representative of the voltage on the fourth pin that resulted from applying the first voltage to the third pin, and (o) automatically comparing the third digital value to a predetermined third expected value, wherein the step (f) of providing the indication is further based the comparing step (o).

Some embodiments of the method 600 further include (p) automatically controlling a coupling of an electrical load to a power connection pin, (q) measuring a voltage of the power connection pin, (r) generating a fourth digital value representative of the voltage on the power connection pin that resulted from applying the electrical load to the power connection pin, and (s) automatically comparing the fourth digital value to a predetermined fourth expected value, wherein the step (f) of providing the indication is further based the comparing step (s).

In some embodiments of the method 600, the electrical load includes a tester display.

Some embodiments of the method 600 further include (t) for each one of a plurality of first pins to which the first test input voltage is coupled, storing, into a table for holding a plurality of values, a measured digital value for each one of a plurality of second pins from which a measured output voltage is obtained, (u) comparing each one of a plurality of values in the table to at least one value of a predetermined set of values, the predetermined set of values including values for a plurality of predefined faults, (v) determining a location of a fault and a type of the fault based on the step (u) of comparing, and (w) providing an output indication of the location and the type of the fault.

In some embodiments of the method 600, the power connection pin is integrated with the bus connector in a unitary body.

Yet another aspect of the present invention provides a data structure 690 for use by a computing device for identifying and locating a plurality of predefined possible faults. In some embodiments, the data structure includes for each one of a plurality of test input voltages, and for each one of a plurality of pins to which an input voltage is applied, a set of expected output voltage values, each value in the set of expected output voltage values corresponding to a voltage on one of the plurality of pins. The set of expected output voltage values includes at least three subsets of values: a no-fault subset of values corresponding to no fault detected, a first fault subset of values corresponding to a predetermined first fault detected and an indication of the first fault, and a second fault subset of values corresponding to a predetermined second fault detected and an indication of the second fault.

In some embodiments of the data structure 690, the indication of the first fault includes an identification of each of two pins that are detected as shorted together, and the indication of the second fault includes an identification of each of two other pins that are detected as shorted together.

Yet another aspect of the present invention provides an electrical connector having a plurality of connection pins suitable for connection to the bus connector, a voltage source operatively coupled to provide a signal, and automatic means as described herein for serially applying the signal to each one of a first set of the plurality of connection pins and measuring a resulting parameter of each one of a second set of the plurality of connection pins.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A system for testing a bus connector comprising:

a microprocessor;

a first analog multiplexor operatively coupled to be controlled by the microprocessor;

an analog-to-digital converter (ADC) circuit operatively coupled to receive an analog signal from the first analog multiplexor and to provide a digital signal to the microprocessor;

a first electrical connector including a plurality of connection pins suitable for connection to the bus connector, and operatively coupled to provide inputs to the first analog multiplexor;

an analog demultiplexor operatively coupled to be controlled by the microprocessor, and including a plurality of analog output connections operatively coupled to the first electrical connector;

a voltage source operatively coupled to provide at least one predetermined voltage signal as an input to the analog demultiplexor;

a second electrical connector having a plurality of connection pins suitable for connection to a power-supply connector, and operatively coupled to provide inputs to the first analog multiplexor;

an output display;

an internal power supply; and an electronically controlled switch operatively coupled to be controlled by the microprocessor, and having a first input operatively coupled to receive power from the internal power supply, a second input operatively coupled to receive power from the second electrical connector, and an output operatively coupled to provide power to the output display such that either the internal power supply or the second electrical connector provides power to run the output display.

2. The system according to claim 1, wherein the microprocessor controls the system to apply the at least one predetermined voltage signal to one pin of the bus connector at a time, and then to test each one of a plurality of the other pins to determine whether the applied voltage does travel to the other pins to which the signal should go and does not travel to the other pins to which the signal should not go.

3. The system according to claim 1, wherein the voltage source provides a plurality of voltages, and further comprising:

a second analog multiplexor operatively coupled to be controlled by the microprocessor, and operatively coupled to receive the plurality of voltages from the voltage source, and operatively coupled to provide an output signal to an input of the analog demultiplexor.

4. The system according to claim 3, wherein the microprocessor at a first time:

controls the second analog multiplexor and the analog demultiplexor to operatively couple a first one of the plurality of voltages to a first one of the connection pins, and controls the first analog multiplexor to operatively couple a second one of the connection pins to the ADC circuit, in order to receive into the microprocessor a digital value from the ADC circuit representative of the voltage on the second pin that resulted from applying the first voltage to the first pin.

5. The system according to claim 4, wherein the microprocessor at a second time:

controls the second analog multiplexor and the analog demultiplexor to operatively couple the first one of the plurality of voltages to a third one of the connection pins, and controls the first analog multiplexor to operatively couple a fourth one of the connection pins to the ADC circuit, in order to receive into the microprocessor a digital value from the ADC circuit representative of the voltage on the fourth pin that resulted from applying the first voltage to the third pin.

6. The system according to claim 5, wherein the microprocessor at a third time:

controls the second analog multiplexor and the analog demultiplexor to operatively couple a second one of the plurality of voltages to a first one of the connection pins, and controls the first analog multiplexor to operatively couple a second one of the connection pins to the ADC circuit, in order to receive into the microprocessor a digital value from the ADC circuit representative of the voltage on the second pin that resulted from applying the second voltage to the first pin.

7. The system according to claim 4, wherein the microprocessor at a fourth time:

controls the second analog multiplexor and the analog demultiplexor to operatively couple a second one of the plurality of voltages to a first one of the connection pins, and controls the first analog multiplexor to operatively couple a second one of the connection pins to the ADC circuit, in order to receive into the microprocessor a digital value from the ADC circuit representative of the voltage on the second pin that resulted from applying the second voltage to the first pin.

8. The system according to claim 1, further comprising:

an electrical load;

wherein the electronically controlled switch operatively coupled to be controlled by the microprocessor is operable to selectively connect the electrical load to the second electrical connector, wherein the second electrical connector is operatively coupled to provide one or more inputs to the first analog multiplexor, and wherein the microprocessor at a fifth time:

controls the electronically controlled switch to operatively couple a pin of the second electrical connector to the electrical load, and controls the first analog multiplexor to operatively couple the pin of the second electrical connector to the ADC circuit, in order to receive into the microprocessor a digital value from the ADC circuit representative of the voltage on the pin of the second electrical connector that resulted from operatively coupling the pin of the second electrical connector to the electrical load.

9. The system according to claim 1, wherein the second electrical connector is operatively coupled to provide one or more inputs to the first analog multiplexor, and wherein the microprocessor at a sixth time:

controls the electronically controlled switch to operatively couple a pin of the second electrical connector to the output display, and controls the first analog multiplexor to operatively couple the pin of the second electrical connector to the ADC circuit, in order to receive into the microprocessor a digital value from the ADC circuit representative of the voltage on the pin of the second electrical connector that resulted from operatively coupling the pin of the second electrical connector to the output display.

* * * * *